(12) United States Patent
Qadri et al.

(10) Patent No.: US 6,246,071 B1
(45) Date of Patent: Jun. 12, 2001

(54) ZIRCONIA-CONTAINING TRANSPARENT AND CONDUCTING OXIDES

(75) Inventors: Syed B. Qadri, Fairfax Station, VA (US); Earl F. Skelton, Washington, DC (US); Alberto Pique, Bowie, MD (US); James S. Horwitz, Fairfax, VA (US); Douglas B. Chrisey, Bowie, MD (US); Heungsoo Kim, Arlington, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/404,722

(22) Filed: Sep. 23, 1999

(51) Int. Cl.$^7$ .......................... H01L 29/12; H01L 23/48; H01L 23/52; H01L 29/40

(52) U.S. Cl. .......................... 257/43; 257/749; 257/761; 257/295

(58) Field of Search .............................. 257/43, 295, 749, 257/761

(56) References Cited

U.S. PATENT DOCUMENTS 4,395,467 * 7/1983 Vossen, Jr. et al. ................ 428/697

* cited by examiner

*Primary Examiner*—Eddie Lee
*Assistant Examiner*—Jesse A. Fenty
(74) *Attorney, Agent, or Firm*—John J. Karasek; George A. Kap

(57) ABSTRACT

This invention pertains to a device of a substrate and a $ZrO_2$-based semiconductor disposed thereon and a method for depositing the semiconductor on the substrate. The semiconductor is typically in the form of a film of 1–20 weight % $ZrO_2$ and 99–80 weight % $In_2O_3$ or $SnO_2$. The semiconductor is tunable in terms of optical transmission and electrical conductivity. Its transmission is in excess of about 80% over the wavelength range of 400–900 nm and its resistivity is from about $1.3 \times 10^{-3}$ $\Omega$-cm to about $6.5 \times 10^{-2}$ $\Omega$-cm. The deposition method is characterized by depositing in a chamber the semiconductor on a substrate by means of a physical vapor deposition whole maintaining a small oxygen pressure in the chamber.

11 Claims, 5 Drawing Sheets

(5 wt. % ZnO₂ + 95 mole % SnO₂)

ZIRCONIA-CONTAINING TRANSPARENT AND CONDUCTING OXIDES

BACKGROUND OF THE INVENTION

1. Field of the Invention

This invention pertains to zirconia-containing transparent and electrically conducting oxide films of indium ($In_2O_3$) and tin ($SnO_2$) and the preparation thereof.

2. Description of Related Art

Transparent and electrically conducting oxides of indium and tin are widely used for variety of applications such as antistatic coatings, light emitters, light detectors and light triggered semiconductor devices, electrodes for flat panel displays and electrochromic devices, solar cells, heat mirrors, smart windows, and the like. The transparent and conducting oxides are wide band-gap semiconductors whose properties depend strongly on the oxidation state (stoichiometry) and on the nature of and quantity of impurities trapped in the film. The properties of transparent and conducting oxide films are very sensitive to the deposition technique, the deposition parameters, the properties of the sputtering target and the post deposition treatment. Transparency of the films is affected by absorptivity, reflectivity and emissivity. These losses are related to the microstructure and surface roughness of the films.

Indium-tin oxide, which is an alloy of 90 weight % indium oxide and 10 weight % tin oxide, has problems with respect to chemical stability at temperatures above about 400° C. Indium oxide ($In_2O_3$) and tin oxide ($SnO_2$) are stable at room temperature and up to about 400° C. but are unstable above about 400° C. This means that being semiconductors, resistance in these oxides declines with temperature until about 400° C. when, due to what is believed to be chemical instability, resistance of $In_2O_3$ and $SnO_2$ reverses itself and starts to increase with higher temperature.

OBJECTS AND BRIEF SUMMARY OF THE INVENTION

It is an object of this invention to produce transparent and electrically conducting oxide films that are stable at high temperatures of at least about 400° C.

It is another object of this invention to produce transparent and conducting oxide films with optical transparency in excess of about 80% over the wavelength region of 400–900 nm.

Another object of this invention is the transparent and conducting oxide films wherein optical transparency and electrical conductivity are tunable depending on amount of zirconium oxide or its substituent in the film.

These and other objects of this invention can be achieved by physical vapor deposition of a film on a substrate from a target that is an alloy of indium oxide and 1–20 weight % zirconium oxide, a material of tin oxide and 1–20 weight % zirconium oxide, or separately from targets of the individual oxides.

BRIEF DESCRIPTION OF THE DRAWINGS

FIGS. 1(a) and (b) are θ/2θ scans taken with CuKα x-ray radiation of $In_2O_3$—$ZrO_2$ film wherein FIG. 1(a) is plot of as-deposited film and FIG. 1(b) is a plot of film that was post-annealed at 400° C.

DETAILED DESCRIPTION OF THE INVENTION

Figure 1:
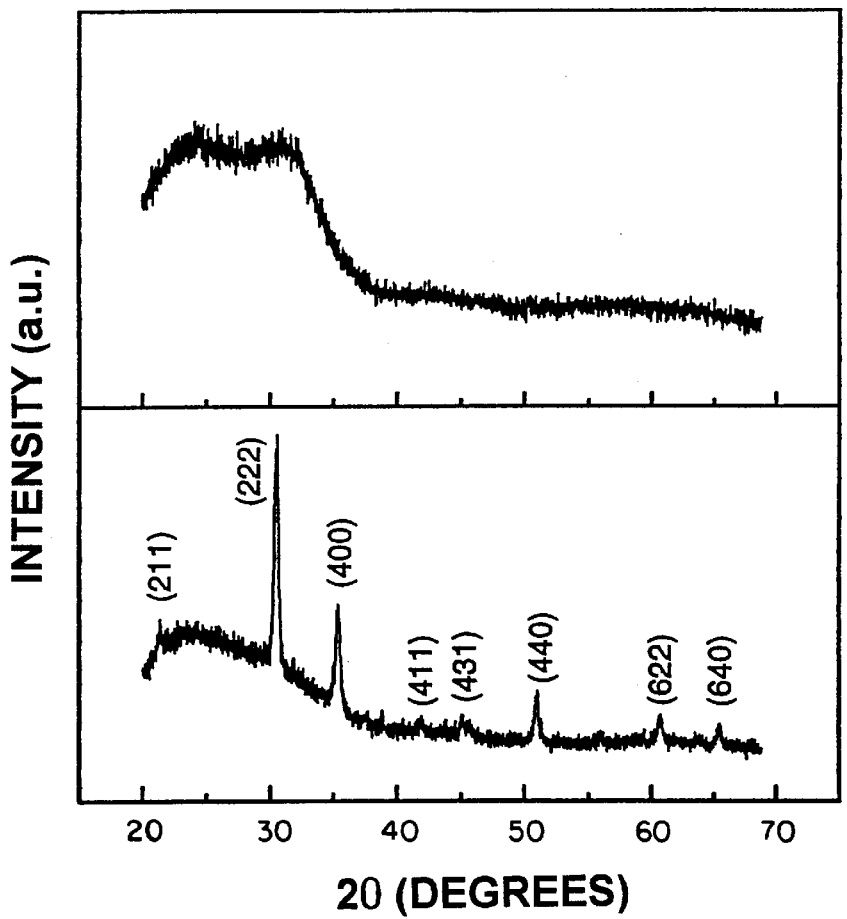

This invention pertains to transparent and conducting oxide film containing zirconium oxide on a substrate and method for preparing same. More specifically, this invention pertains to stable and optically transparent and electrically conductive film disposed on and adhering to a substrate, the film being an alloy of indium oxide and 1–20 weight percent zirconium oxide or a material of tin oxide and 1–20 weight percent zirconium oxide. These films are chemically stable at temperatures of about 400° C. and above; and have transmission in excess of about 80% over the visible spectral range of about 400–900 nm, for film thickness of 300 nm;.

Room temperature resistivity of the $In_2O_3$—$ZrO_2$ films varies from about $1.3 \times 10^{-3}$ Ω-cm to about $6.5 \times 10^{-2}$ Ω-cm over the range of 1–15 weight % zirconium oxide. The method of preparing coated substrates with the stable transparent and conducting films is characterized by physical vapor deposition of the film onto a substrate maintained at about room temperature disposed in a deposition chamber maintained at an oxidizing pressure of above 5 and below 15 milli Torr oxygen.

The structure of the device includes a substrate and a film thereon on the entire substrate or any part thereof The substrate can be of any material since it is maintained at about room temperature when the film is deposited thereon, however, it must be able to withstand the annealing temperature of about 400° C. The substrate can be made of wood, bone, glass, metal, polymer, or a refractory material that is inert and adheres to the film. The substrate is typically glass or quartz. The substrate can be of any shape or size and typically of sufficient thickness to render the substrate structurally rigid or of moderate flexibility. Typically, the substrate is in the shape of a disk 2–20 cm in diameter with thickness typically on the order of less than 1 centimeter, more typically 1–5 mm. The fit s annealed at 400° C. and is converted to crystalline form from amorphous.

The film disposed on the substrate is a semiconductor of $In_2O_3$—$ZrO_2$ or $SnO_2$—$ZrO_2$ containing 1–20 weight %, preferably 1–15 weight % $ZrO_2$, or whatever zirconia becomes when alloyed with indium oxide or tin oxide. Presence of zirconium oxide in the alloys can be determined by means of x-ray diffraction or by means of x-ray fluorescence. The film is a semiconductor on the basis of characterization of semiconductors as typically having reduced resistance at higher temperatures. The film can be deposited on any surface of the substrate or any part thereof and film thickness is typically 50 nm to 5000 nm, more typically 100 nm to 3000 nm. These thicknesses qualify the coating on the substrate as a film.

At room temperature, indium oxide and tin oxide are electrically conductive, have greater than about 80% transparency, their scratch resistance can be improved, and they are chemically stable to about 400° C. Above about 400° C., indium oxide and tin oxide are chemically unstable in that they disintegrate or degenerate. By adding zirconia or zirconium oxide to indium oxide and tin oxide and making films of $In_2O_3$—$ZrO_2$ and $SnO_2$—$ZrO_2$, it was discovered that the films with 1–20 weight percent added zirconia, became chemically stable above 400° C. By addition of 1–20% zirconia, chemical stability of the $In_2O_3$—$ZrO_3$ films was improved to about 600° C. whereas for the $SnO_2$—$ZrO_2$ films, chemical stability was improved to about 500° C. Addition of even 1% zirconia to indium oxide or tin oxide resulted in improvement in chemical stability of the resulting film. Chemical stability of the films was not further improved by the addition of more than about 20 weight % zirconia. Scratch resistance and erosion resistance was improved by the addition of even small amounts of zirconia because zirconia is the hardest material known next to diamond.

The $In_2O_3$—$ZrO_2$ films are electrically non-conducting at about 20 weight % $ZrO_2$ whereas the $SnO_2$—$ZrO_2$ films are barely conducting with 5 weight % $ZrO_2$. This is governed by the fact that zirconium oxide is electrically non-conducting. Electrical conductivity of these films is governed by the fact that zirconium, which has +4 valence in zirconium oxide, replaces indium in indium oxide where indium has a valence of +3. Thus, the conductivity mechanism of $In_2O_3$—$ZrO_2$ may be due to extra electron available on substitution. This substitution of Zr on an In site takes place up to 15 weight % of $ZrO_2$ and above. In the case of $SnO_2$—$ZrO_2$, there is no formation of $SnO_2$—$ZrO_2$ solid solution and therefore, the mechanism of electrical conductivity in this system may be similar to that of $SnO_2$ alone. Therefore, the effect of adding $ZrO_2$ does not affect the electrical conductivity but it elevates the stability region to a higher temperature range.

Further with respect to the $SnO_2$—$ZrO_2$ films, it was not known that one could add up to about 5 weight % $ZrO_2$ to these alloys and still obtain an electrically semiconducting film, meaning that resistance declined with temperature unlike conductors wherein resistance increased with temperature. It is also important to note that in the $SnO_2$—$ZrO_2$ oxides, electrical conductivity is not a linear relationship.

The films of this invention are stable and develop no micro cracks as they are cycled over a wide temperature range; and maintain transparency of more than 80% in the visible range of 400–900 nm.

Preparation of the devices comprising a film on a substrate can be achieved by physical vapor deposition techniques at room temperature. Examples of physical vapor deposition techniques include electron beam evaporation, magnetron sputtering, pulsed laser deposition, and the like. Pulsed laser deposition is typically used since it has the advantage of replicating the stoichiometry of the target, assuming a target of appropriate composition is used so that a film of $In_2O_2$—$ZrO_2$ or $SnO_2$—$ZrO_2$ of desired thickness is deposited on the substrate. The target, typically of a disc-shape, need not be of the desired composition since separate targets of $SnO_2$ and $ZrO_2$ can be used. If separate targets are used, care must be taken to adjust deposition rate so that an appropriate alloy is deposited.

A laser or another deposition means is used to deposit the film on a substrate from one or more targets. In a typical deposition scheme, a substrate is positioned in a deposition chamber some distance below the target and the target is bombarded by a force in the form of amplified light, electrons, ions, or the like, whereby the coating on the target is vaporized and the vapors are deposited on the substrate while a low oxidizing pressure is maintained in the chamber. If the target has a coating layer deposited thereon that corresponds to the desired composition of the film disposed on the substrate, then appropriate deposition technique can be selected to deposit a layer on the substrate that will have the same composition as the material on the target. However, if multiple targets are used on the components of the alloy or a deposition technique is used that does not replicate stoichiometry of the material on the target, deposition rate is then adjusted so that a film of desired composition is deposited on the substrate. If a deposition technique is used which does not rely on a chamber, then physical vapor deposition from a target is directed so that the film of desired composition is deposited on the substrate.

A typical target is a glass disk 2–20 cm in diameter and 1–5 cm in thickness with a layer or coating of the film thereon in a thickness of typically 1–5 cm. So, thickness of a typical target, with the alloy or a component thereon, is 2–10 cm. Distance between the substrate and the target or targets in the chamber is typically 2–10 cm and the pressure in the chamber should be selected to yield a film with the desired characteristics, particularly transparency and electrical conductivity. The substrate should be maintained at about room temperature. Typical deposition rate on the substrate is up to about 5 Å/sec, more typically 0.1–3 Å/sec.

Preparation of an $In_2O_3$—$ZrO_3$ alloy film is demonstrated using pulsed laser deposition technique which has the advantage of replicating stoichiometry of the target. The film was deposited from a sintered target disposed in a deposition chamber consisted of two parts: a substrate and a film deposited thereon. Deposited on the quartz disk was the alloy of 90 weight % $In_2O_3$ and 10 weight % $ZrO_2$. Quart substrate was 2.54 cm×2.54 cm×0.508 cm and was cleaned in ultrasonic cleaner for 10 minutes with acetone, followed, a similar cleaning procedure using methane. The optimum deposition conditions consisted of keeping the substrate at room temperature of 22° C. during film deposition and maintaining the deposition chamber at the background oxygen or oxidizing pressure of 10 mm Torr by continuously introducing oxygen into the chamber.

A KrF excimer laser (Lambda Physics LPX 305, 248 nm and 30 ns FWHM) was the energy source used in the pulsed laser deposition technique. The laser was operated at 10 Hz and focused through a 50-cm focal length onto the rotating target at a 45° angle of incidence. The focal spot size was about 0.1 $cm^2$, which resulted in a fluence of about 2J/$cm^2$ on the target. The substrate was located at a distance of 4.7 cm from the target. The deposition rate was 0.9 Å pulse.

The film deposited on the quartz substrate was an alloy of 90 weight % $In_2O_3$ and 10 weight % $ZrO_2$ and its thickness was 244 nm, as determined by stylus profilometer. Film deposition took less than about 1 hour. The substrate with the film thereon was then removed from the chamber and annealed by heating at 400° C. for about 1 hour, thus converting amorphous phase to crystalline. $In_2O_3$—$ZrO_2$ alloys prepared by pulse laser deposition with different amounts of $ZrO_2$ varying from 5 weight % to 20 weight % were tested for electrical and optical properties, results of which are set forth in Table A, below:

TABLE A

| $ZrO_2$ Content (wt. %) | Film Thickness (nm) | Sheet Resistance (Ω/□) | Band Gap (eV) | Refr. Index @ 500 nm |
|---|---|---|---|---|
| 5 | 260 | 67 | 3.63 | 1.98 |
| 10 | 244 | 130 | 3.74 | 2.03 |

TABLE A-continued

| $ZrO_2$ Content (wt. %) | Film Thickness (nm) | Sheet Resistance ($\Omega/\square$) | Band Gap (eV) | Refr. Index @ 500 nm |
|---|---|---|---|---|
| 15 | 310 | 255 | 3.83 | 2.19 |
| 20 | 300 | 2160 | 3.99 | 2.20 |

FIG. 1 shows θ/2θ scans for an $In_2O_3$—$ZrO_2$ film containing 10 weight % $ZrO_2$ taken with $CuK_\alpha$ which reflected from a graphite monochromator. A radial scan of the as-deposited film is given in FIG. 1(a) and the pattern of the same film after annealing the film on the quartz substrate at 400° C. in air, is given in FIG. 1(b). Peaks corresponding to the cubic phase of $In_2O_3$ can be easily identified in FIG. 1(b), whereas the as-deposited film was amorphous. Annealing at 400° C. results in a cubic phase consistent with cubic phase of $In_2O_3$, as reported in the literature. A lattice parameter of 10.180 ±0.69 Å was obtained using a least square refinement of the peak positions indexed with Miller indices in FIG. 1(b). A slight increase in the lattice parameter from the bulk $In_2O_3$ can be explained due to formation of a solid solution of $In_2O_3$ and $ZrO_2$. The cubic phase of $ZrO_2$ has a lattice parameter of 5.135 Å, which is nearly one half of $In_2O_3$ and is a good lattice match.

Figure 2:
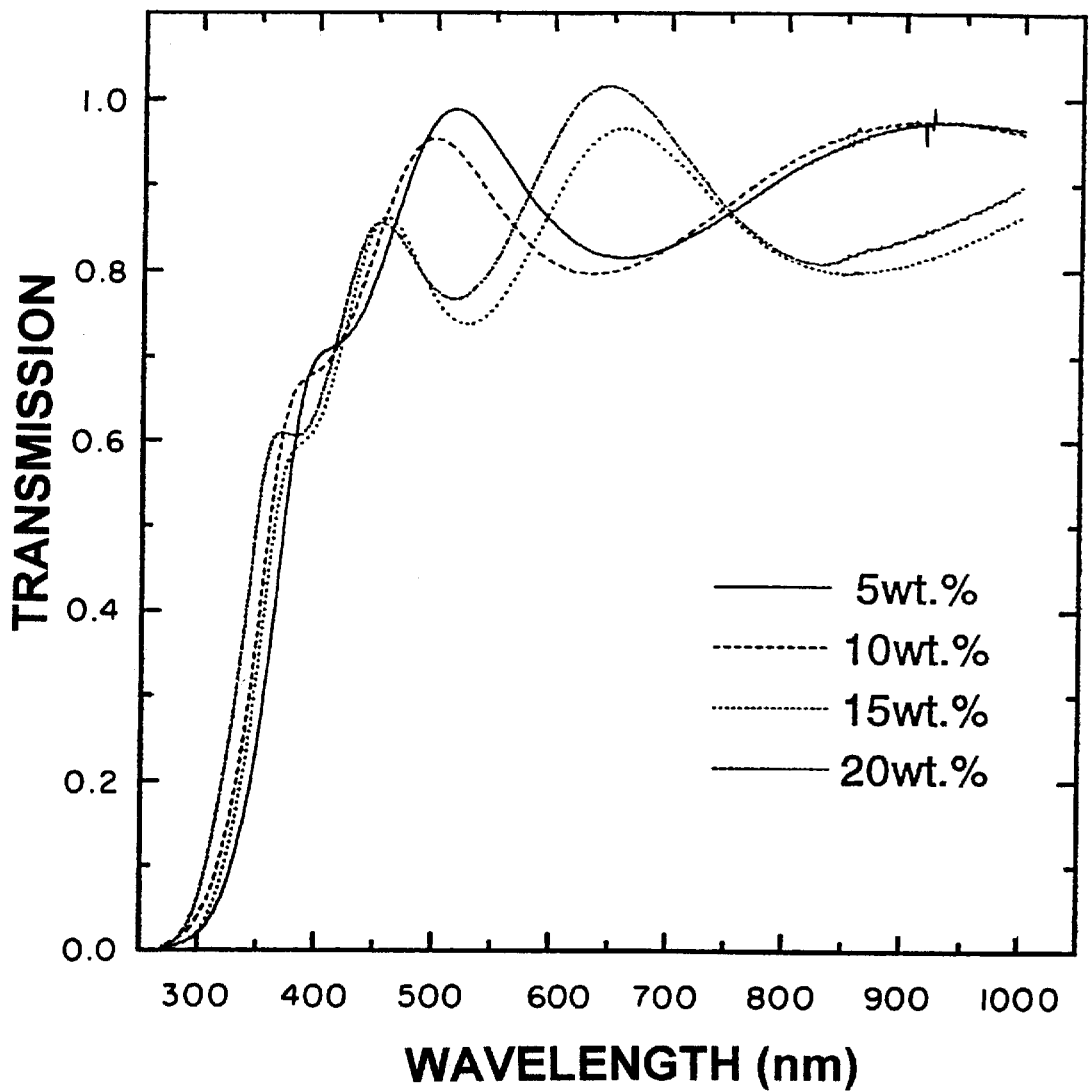
FIG. 2 is a graph of optical transmittance data for the 90–10 weight % ratio of $In_2O_3ZrO_2$ film prepared by pulsed laser deposition technique as a function of zirconia content.

The optical absorption measurements between 250 nm and 1000 nm showed an average transmission of more than about 80% over the visible range of 400 nm to 900 run. FIG. 2 shows the transmission curves for the compositions of 95–80 weight % $In_2O_3$ and 5–20 weight % $ZrO_2$. The values of energy gaps, $E_g$, were determined by extrapolations of the straight regions of the square of the absorption coefficients, $\alpha^2$, versus photon energy hv. The absorption coefficient was determined by the equation, $\alpha=\ln(1/T)/d$, where T is the transmissivity and d is the film thickness. The energy gaps, $E_g$, as a function of composition are given in Table A and showed monotonic increase from 3.63 eV to 3.99 eV as the weight % of $ZrO_2$ increased to 20. The energy gaps were fitted by a least square method to the following linear relation:

$$E_g=3.505+2.34y$$

where $0 \leq y \leq 1.0$. For y=0, the energy gap, $E_g$, of $In_2O_3$ is 3.505 eV which is in reasonable agreement with the value of 3.75 eV reported in the literature. For y=1, which is the case for pure $ZrO_2$, a value of 5.845 eV was obtained from the above expression, which is in the range of values 5.0–5.85 eV reported in the literature. The refractive indices at a wavelength of 500 nm for 5 wt %, 10 wt %, 15 wt %, and 20 wt % of $ZrO_2$ are also given in Table A and showed a monotonic increase from 1.94 to 2.17 with the composition. Refractive indices of the films were determined from the reflectance data using the relation: $nd=k\lambda/4$, where n is the refractive index, d is the film thickness in nm, $\lambda$ is the wavelength in nm, and k is the interference order i.e., an odd integer.

Figure 3:
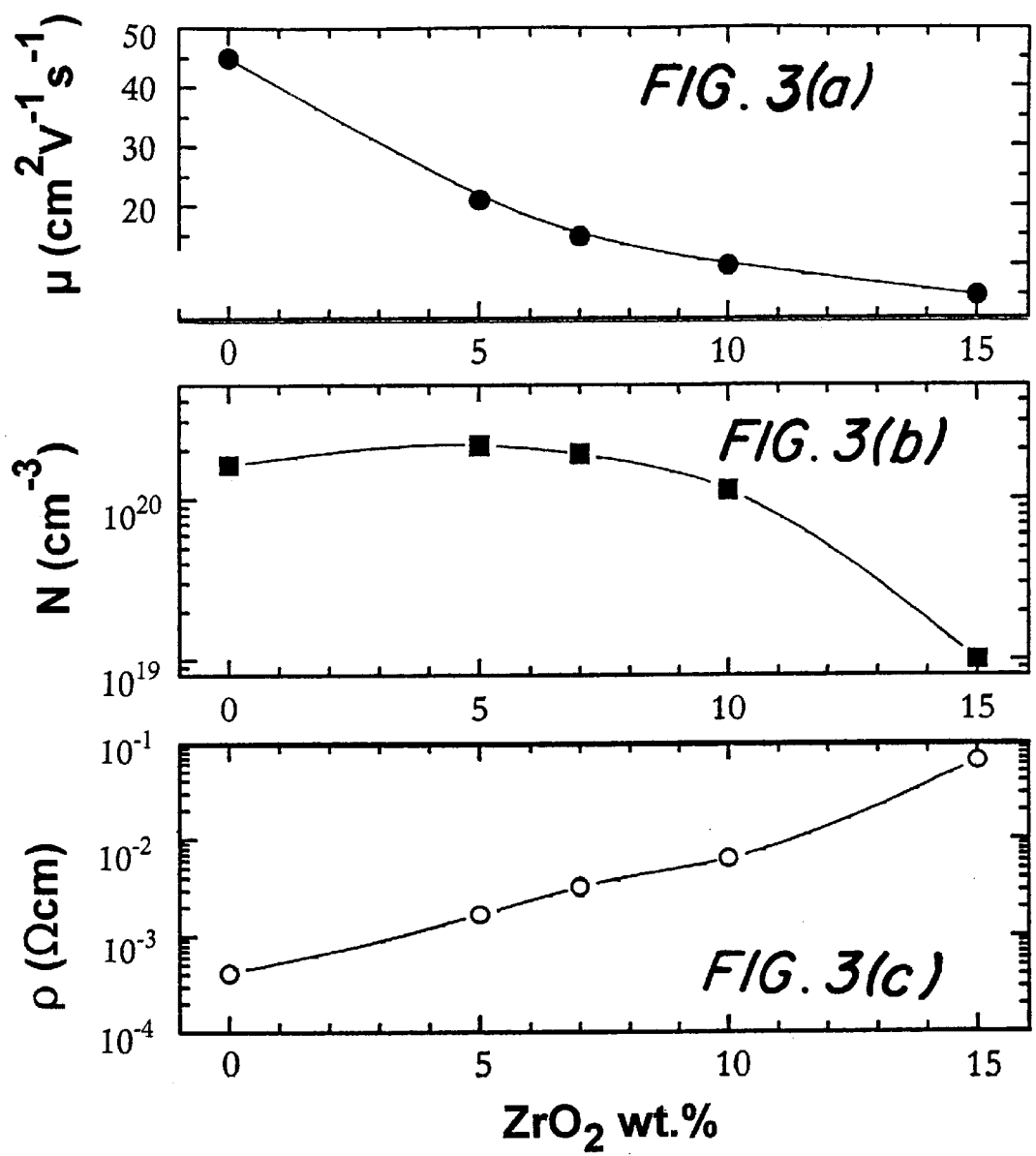
FIG. 3(a)–(c) are graphs of Hall mobilities, 3(a), carrier densities 3(b), and resistivities 3(c) for the 90–10 weight % ratio of $In_2O_3$—$ZrO_2$ film.

The electrical resistivities of the films increased smoothly as a function if increasing $ZrO_2$ content and are shown in FIG. 3 (c). They range between $3\times10^{-4}$ to $6.5\times10^{-2}$ $\Omega$cm. Films with 16 wt % and 20 wt % of $ZrO_2$ were insulating. The changes in resistivity could be explained by the variation in the band gaps as a function of composition. The sheet resistance of the films as a finction of composition are also given in Table A. They show a variation between 51 $\Omega/\square$ for 2.3 wt % $ZrO_2$ to 2160 $\Omega/\square$ for 15 wt % $ZrO_2$. Thus, the sheet resistance were also consistent with the resistivities and band gaps as a finction of composition.

Hall effect measurements in FIG. 3(a) show that these films are n-type semiconductors with carrier densities shown in FIG. 3(b) in the range between $2.35\times10^{20}$–$9.5\times10^{18}$/cm$^3$ and Hall mobilities between 45–4.9 cm$^2$/Vs as the $ZrO_2$ composition was increased to 15 wt %. The Hall mobility and the carrier densities are also consistent with the resistivities, sheet resistance, band gaps as a function of increasing $Zro_2$ composition.

Figure 4:
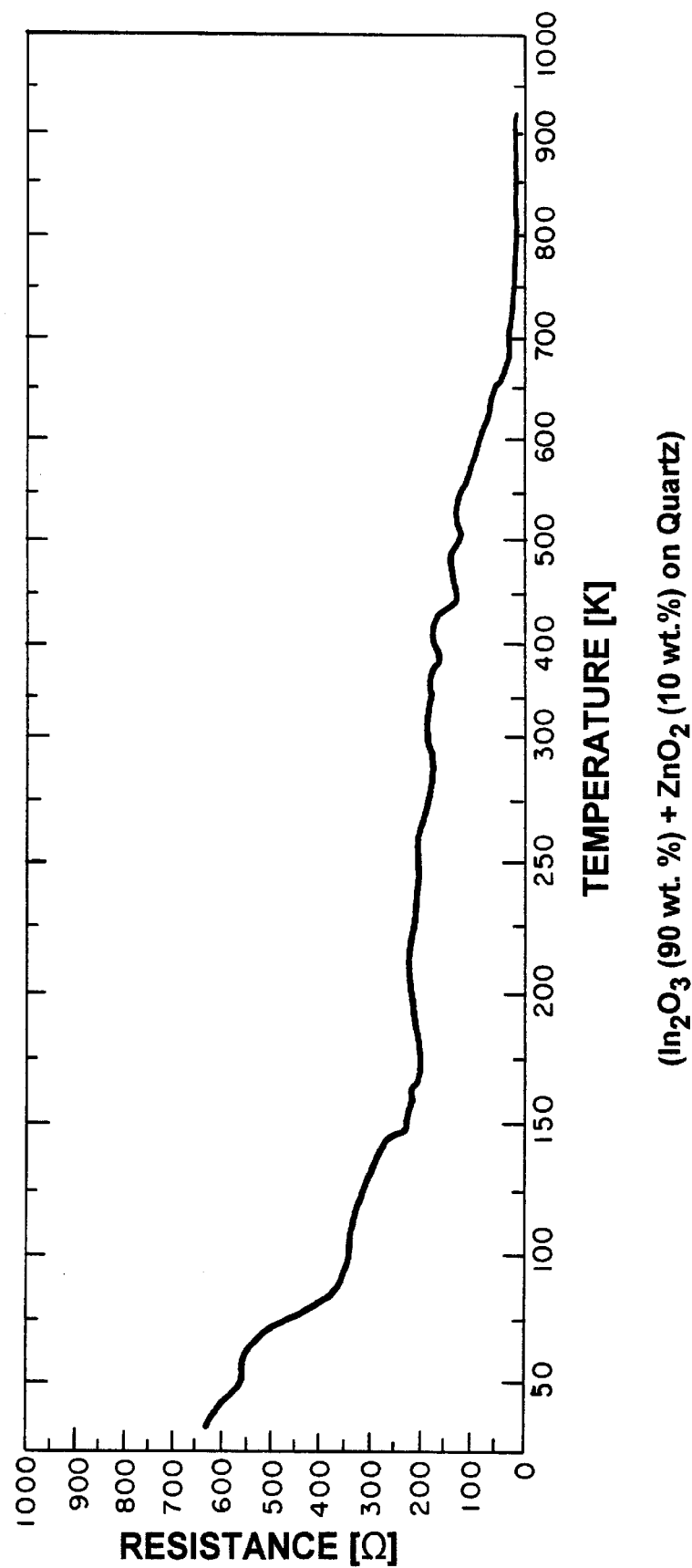
FIG. 4 is a plot of Resistance in ohms (Ω) versus Temperature in Kelvin for 90–10 weight percent ratio over the temperature range of zero K to over 900K.

FIG. 4 is a graph which shows resistance variation with temperature over the temperature range of 0–900 K for the alloy film of 90 weight % $In_2O_3$ and 10 weight % $ZrO_2$. As shown in FIG. 4, resistance declines from about 650 ohms at 0 K to about 50 ohms at 900 K.

Figure 5:
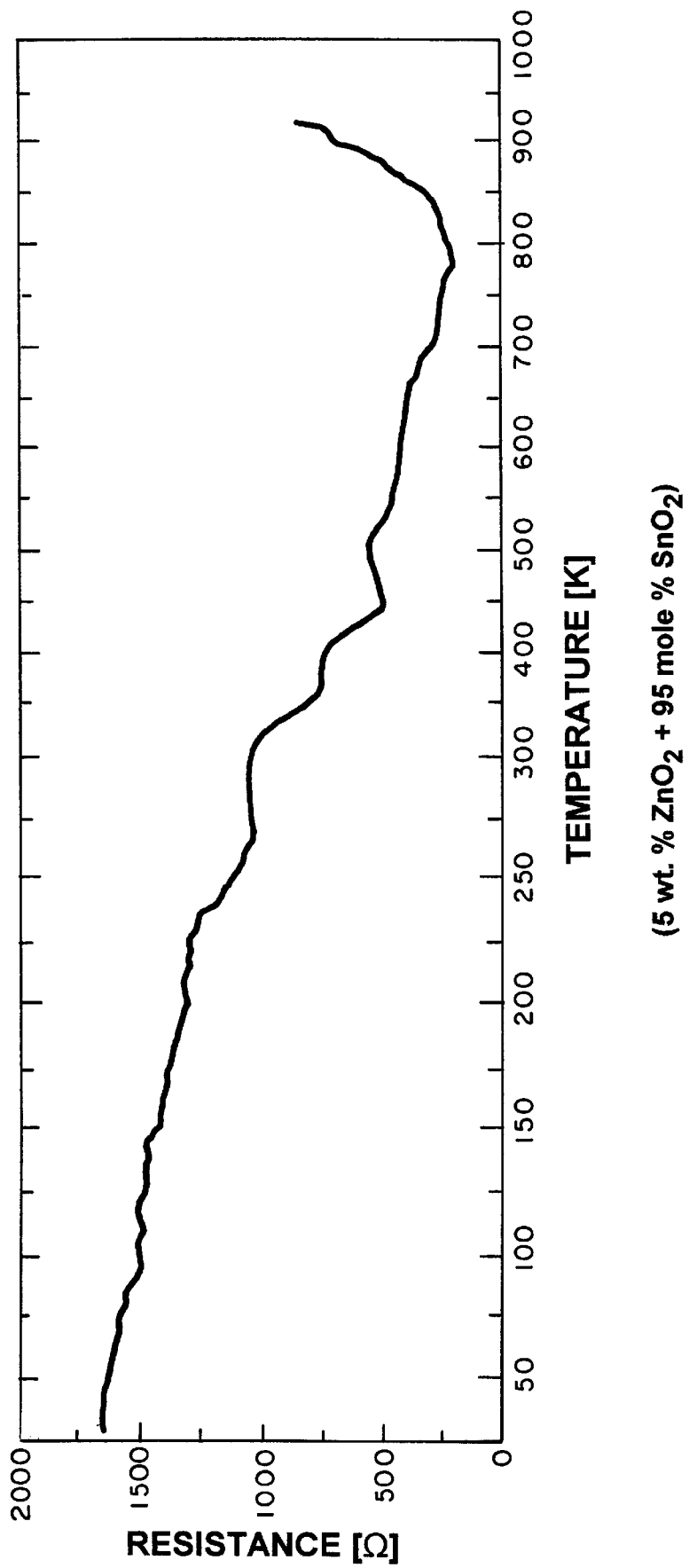
FIG. 5 is a plot of Resistance in ohms (Ω) versus $SnO_2$—$ZrO_2$, respectively, over the temperature range of zero K to over 900K.

FIG. 5 is a graph which shows resistance variation with temperature over the temperature range of 0–900 K for the semiconductor material consisting of 95 weight % $SnO_2$ and 5 weight % $ZrO_2$. As shown in FIG. 5, resistance declines from about 1670 ohms at 0 K to about 200 ohms at about 920 K.

The transparent and conducting oxide films of this invention offer tunable band gaps, resistivities and sheet resistivities while being more than about 80% transparent over the 400–900 nm wavelength range.

Many modifications and variations of the present invention are possible in light of the above techniques. It is, therefore, to be understood that within the scope of the appended claims, the invention may be practiced otherwise than as specifically described herein.

What is claimed is:

1. A device that is chemically stable above about 400° C. comprising a substrate and a semiconductor disposed thereon, said semiconductor comprises a material of 1–20 weight % zirconium oxide and 99–80 weight % of a metallic oxide selected from the group consisting of indium oxide, tin oxide, and mixtures thereof.

2. The device of claim 1 wherein said semiconductor is a film and wherein said substrate is made from material selected from the group consisting of wood, bones, glass, metal, polymer, and mixtures thereof.

3. The device of claim 2 wherein said substrate is glass.

4. The device of claim 3 wherein said semiconductor is 50 nm to 5000 nm thick.

5. The device of claim 3 wherein said semiconductor is 100 nm to 3000 nm thick.

6. The device of claim 5 wherein said semiconductor is a film of 1–15 weight % zirconium oxide and 99–85 weight % metallic oxide selected from the group consisting of indium oxide, tin oxide, and mixtures thereof.

7. The device of claim 5 wherein said substrate has a glass surface and said semiconductor is an alloy film of 99–85 weight % indium oxide and 1–15 weight % zirconium oxide disposed on said glass surface.

8. The device of claim 7 wherein said substrate is glass and said semiconductor has optical transmission in excess of about 80% in the wavelength region of 400–900 nm.

9. The device of claim 2 wherein said substrate is 100 nm to 3000 nm thick, said semiconductor is electrically conducting and has transmission of at least about 80% over the wavelength region of 400–900 nm.

10. The device of claim 9 wherein said substrate is quartz and said semiconductor is an alloy film of 99–85 weight % $In_2O_3$ and 1–15 weight % $ZrO_2$.

11. The device of claim 10 wherein said semiconductor is an alloy film of about 90 weight % $In_2O_3$ and about 10 weight % $ZrO_2$.

* * * * *